(12) United States Patent
Lee

(10) Patent No.: US 10,311,941 B1
(45) Date of Patent: Jun. 4, 2019

(54) APPARATUSES AND METHODS FOR INPUT SIGNAL RECEIVER CIRCUITS

(71) Applicant: MICRON TECHNOLOGY, INC., Boise, ID (US)

(72) Inventor: Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/950,041

(22) Filed: Apr. 10, 2018

(51) Int. Cl.
  *H03F 1/02* (2006.01)
  *G11C 11/40* (2006.01)
  *G11C 11/4096* (2006.01)
  *H03F 3/45* (2006.01)
  *H03F 3/195* (2006.01)

(52) U.S. Cl.
  CPC ........ *G11C 11/4096* (2013.01); *H03F 1/0205* (2013.01); *H03F 3/195* (2013.01); *H03F 3/45179* (2013.01); *H03F 2203/45111* (2013.01)

(58) Field of Classification Search
  CPC .......................... H03F 1/0205; G11C 11/4096
  See application file for complete search history.

(56) References Cited

U.S. PATENT DOCUMENTS

| | | | | |
|---|---|---|---|---|
| 6,339,344 B1* | 1/2002 | Sakata | ........... | H03K 19/018528 326/83 |
| 6,396,329 B1* | 5/2002 | Zerbe | ........ | G11C 7/02 327/319 |
| 6,990,001 B2* | 1/2006 | Ma | .......... | G11C 11/56 365/154 |
| 2004/0217812 A1* | 11/2004 | Jaussi | ...... | H03F 1/486 330/253 |
| 2013/0316671 A1* | 11/2013 | Stockinger | ............... | H04B 1/18 455/341 |
| 2015/0109007 A1* | 4/2015 | Townsend | ........... | H03F 3/45179 324/692 |

* cited by examiner

*Primary Examiner* — Patricia T Nguyen
(74) *Attorney, Agent, or Firm* — Dorsey & Whitney LLP

(57) ABSTRACT

Apparatuses and methods for input signal receiver circuits are disclosed. An example apparatus includes an amplifier stage configured to receive a reference voltage and an input signal. The amplifier stage is configured to provide in a first mode a first output having a complementary logic level to the input signal and a second output having a same logic level to the input signal and is further configured to provide in a second mode the first output unrelated to the input signal and the second output having a same logic level to the input signal. The example apparatus further includes a pull-up circuit and a pull-down circuit. The pull-up circuit is configured to provide a high logic level voltage to a common node when activated by the first output. The pull-down circuit is configured to provide a low logic level voltage to the common node when activated by the second output.

20 Claims, 4 Drawing Sheets

US 10,311,941 B1

APPARATUSES AND METHODS FOR INPUT SIGNAL RECEIVER CIRCUITS

BACKGROUND

High data reliability, high speed of memory access, and reduced chip size are features that are demanded from semiconductor memory. In recent years, there has been an effort to increase access speed while reducing power consumption for semiconductor devices. As part of that effort to increase access speed, it may be desirable to include input signal receiver circuits having faster operation for receiving address signals, command signals, and clocks. Simultaneously, it may be desirable to accommodate a wide range of input signals at the input signal receiver circuits to meet recent semiconductor devices (e.g., low-power double data rate synchronous DRAM).

Typical signal receiver circuits include differential amplifier circuits that receive an input signal and amplify a voltage difference between the input signal and a reference voltage. The differential amplifier circuits remain active in order to be ready to receive asynchronous input signals that include information at any time during operation. Remaining active during operation, however, continually consumes power. The continual power consumption is not insignificant, and in low power systems, may be undesirable.

Therefore, it may be desirable for alternative input signal receiver circuits with reduced power consumption during operation.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the disclosure described herein should not be construed to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
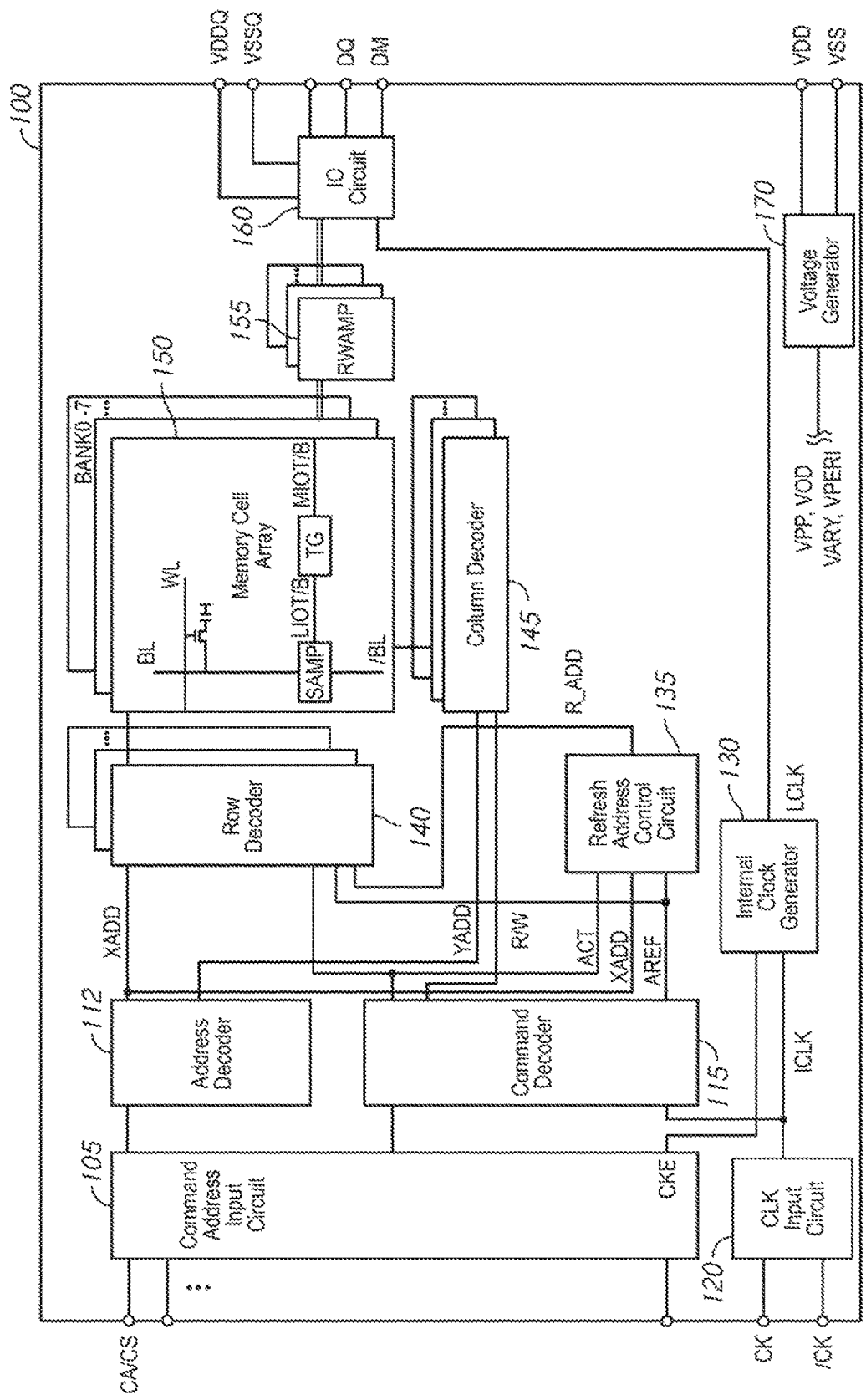
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred to as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command and address and chip select (CA/CS) terminals coupled to a command and address bus to receive commands and addresses, and a CS signal, clock terminals to receive clocks CK and /CK, data terminals DQ and DM, and power supply terminals VDD, VSS, VDDQ, and VSSQ.

The CA/CS terminals may be supplied with memory addresses. The memory addresses supplied to the CA/CS terminals are transferred, via a command/address input circuit 105, to an address decoder 112. The address decoder 112 receives the address and supplies a decoded row address XADD to the row decoder 140 and to a refresh address control circuit 135, and supplies a decoded column address YADD to the column decoder 145. The CA/CS terminals may be supplied with commands. The commands may be provided as internal command signals to a command decoder 115 via the command/address input circuit 105. The command decoder 115 includes circuits to decode the internal command signals to generate various internal signals and commands for performing operations. For example, the command decoder 115 may provide a row command signal ACT to select a word line and a column command signal R/W to select a bit line, and a refresh command signal AREF to perform memory array refresh operations. The refresh address control circuit 135 provides refresh addresses R_ADD to the row decoder 140 when activated by the ACT and AREF command signals.

When a read command is received, and a row address and a column address are timely supplied with the read command, read data is read from a memory cell in the memory array 150 designated by the row address and column address. The read command is received by the command decoder 115, which provides internal commands so that read data from the memory array 150 is output to outside from the data terminals DQ via the read/write amplifiers 155 and the input/output circuit 160. When the write command is received, and a row address and a column address are timely supplied with the write command, write data supplied to the data terminals DQ is written to a memory cells in the memory array 150 designated by the row address and column address. A data mask may be provided to the data terminals DM to mask portions of the data when written to memory. The write command is received by the command decoder 115, which provides internal commands so that the write data is received by data receivers in the input/output circuit 160, and supplied via the input/output circuit 160 and the read/write amplifiers 155 to the memory array 150.

The clock terminals CK and /CK are supplied with external clocks that are provided to an input buffer 120. The external clocks may be complementary. The input buffer 120 generates an internal clock ICLK based on the CK and /CK clocks. The ICLK clock is provided to the command decoder 115 and to an internal clock generator 122. The internal clock generator 122 provides various internal clocks LCLK based on the ICLK clock. The LCLK clocks may be used for timing the operation of various internal circuits. For example, the clocks may be provided to the input/output circuit 160 for timing the operation of the input/output circuit 160 to provide and receive data on the data terminals DQ.

The power supply terminals VDD and VSS are supplied with power supply potentials. These power supply potentials are supplied to an internal voltage generator circuit 170. The internal voltage generator circuit 170 generates various internal potentials VPP, VOD, VARY, VPERI, and the like based on the power supply potentials supplied to the power supply terminals VDD and VSS. The internal potential VPP is mainly used in the row decoder 140, the internal potentials VOD and VARY are mainly used in the sense amplifiers SAMP included in the memory array 150, and the internal potential VPERI is used in many peripheral circuit blocks.

The power supply terminals VDDQ and VSSQ are also supplied with power supply potentials. The power supply potentials are supplied to the input/output circuit 160. The power supply potentials supplied to the power supply terminals VDDQ and VSSQ may be the same potentials as the power supply potentials supplied to the power supply terminals VDD and VSS in an embodiment of the disclosure. The power supply potentials supplied to the power supply terminals VDDQ and VSSQ may be different potentials from the power supply potentials supplied to the power supply terminals VDD and VSS in another embodiment of the disclosure. The power supply potentials supplied to the power supply terminals VDDQ and VSSQ are used for the input/output circuit 160 so that power supply noise generated by the input/output circuit 160 does not propagate to the other circuit blocks.

Figure 2:
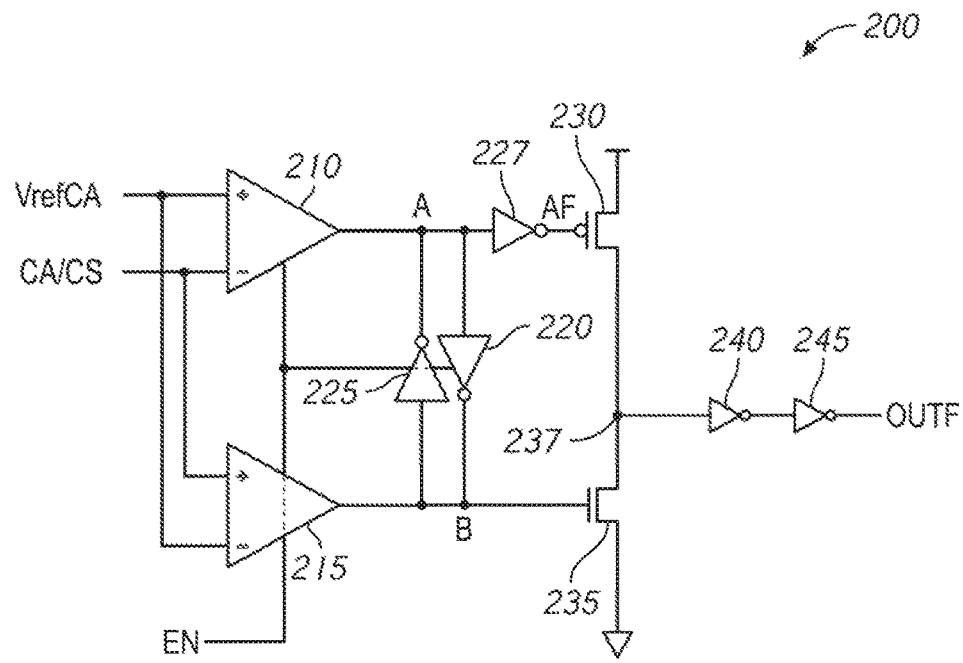
FIG. 2 is a schematic diagram of a prior art signal receiver circuit.

FIG. 2 is a schematic diagram of a prior art signal receiver circuit 200. The signal receiver circuit 200 includes a differential amplifier circuit 210 that receives a reference voltage VrefCA at a non-inverting input (+) and receives an input signal CA/CS at an inverting input (−). The signal receiver circuit further includes a differential amplifier circuit 215 that also receives the VrefCA voltage and the CA/CS signal. However, in contrast to the differential amplifier circuit 210, the differential amplifier circuit 215 receives the CA/CS signal at a non-inverting input (+) and receives the VrefCA voltage at an inverting input (−). The differential amplifier circuits 210 and 215 further receive an enable signal EN. The differential amplifier circuits 210 and 215 are activated by an active EN signal (e.g., active high logic level). The CA/CS signal may represent command signals, address signals, chip select signals, or the like. The CA/CS signal has a voltage that represents a logic level, for example, a relatively high logic level voltage represents a high logic level (e.g., "1" logic level) and a relatively low logic level voltage represents a low logic level (e.g., "0" logic level). The VrefCA voltage represents a reference voltage against which the voltage of the CA/CS signal is compared by the differential amplifier circuits 210 and 215 when activated by an active EN signal.

When activated by an active EN signal, the differential amplifier circuit 210 provides an output to node A having a voltage that represents a high logic level, for example, a high logic level voltage, when the voltage of the CA/CS signal is less than the VrefCA voltage. Conversely, when the voltage of the CA/CS signal is greater than the VrefCA voltage, the differential amplifier circuit 210 provides an output to node A having a voltage that represents a low logic level, for example, a low logic level voltage. When activated by an active EN signal, the differential amplifier circuit 215 provides an output to node B having a voltage that represents a low logic level, for example, the low logic level voltage, when the voltage of the CA/CS signal is less than the VrefCA voltage. Conversely, when the voltage of the CA/CS signal is greater than the VrefCA voltage, the differential amplifier circuit 215 provides an output to node B having a voltage that represents a high logic level, for example, the high logic level voltage.

As shown, receipt of the CA/CS signal and the VrefCA voltage at opposite inputs for the differential amplifier circuits 210 and 215 cause the differential amplifier circuits to provide respective outputs that are complementary. For example, when the voltage of the CA/CS signal is greater than the VrefCA voltage, the differential amplifier circuit 210 provides a high logic level output to node A and the differential amplifier circuit 215 provides a low logic level output to node B. Conversely, when the voltage of the CA/CS signal is less than the VrefCA voltage, the differential amplifier circuit 210 provides a low logic level output to node A and the differential amplifier circuit 215 provides a high logic level output to node B.

The signal receiver circuit 200 further includes inverter circuits 220 and 225 that are coupled to nodes A and B, and receive the EN signal. When activated by an active EN signal each of the inverter circuits 220 and 225 provide an output having a logic level complementary to the logic level of an input signal. By coupling the inverter circuits 220 and 225 to nodes A and B as shown in FIG. 2, the inverter circuits 220 and 225 operate as a latch that latches the logic levels at nodes A and B provided by the differential amplifier circuits 210 and 215, respectively.

The output of the differential amplifier circuit 210 is inverted by an inverter circuit 227 to provide an output at node AF. The complement of the output of the differential amplifier circuit 210 is provided to a p-channel transistor 230. The output of the differential amplifier circuit 215 is provided to an n-channel transistor 235. The transistors 230 and 235 are coupled at a common node 237 that is shared by drains of the respective transistors 230 and 235. The transistor 230 is further coupled to a power supply that provides a high logic level voltage and the transistor 235 is further coupled to a voltage reference, such as ground, that may represent a low logic level voltage.

When a high logic level output is provided to node A and a low logic level output is provided to node B, transistor 230 is activated and the transistor 235 is not activated. As a result, a high logic level is provided at the common node 237. When a low logic level output is provided to node A and a high logic level output is provided to node B, transistor 230 is not activated and the transistor 235 is activated. As a result, a low logic level is provided at the common node 237. Inverter circuits 240 and 245 buffer the voltage at the common node 237 and provide an output OUTF.

Figure 3:
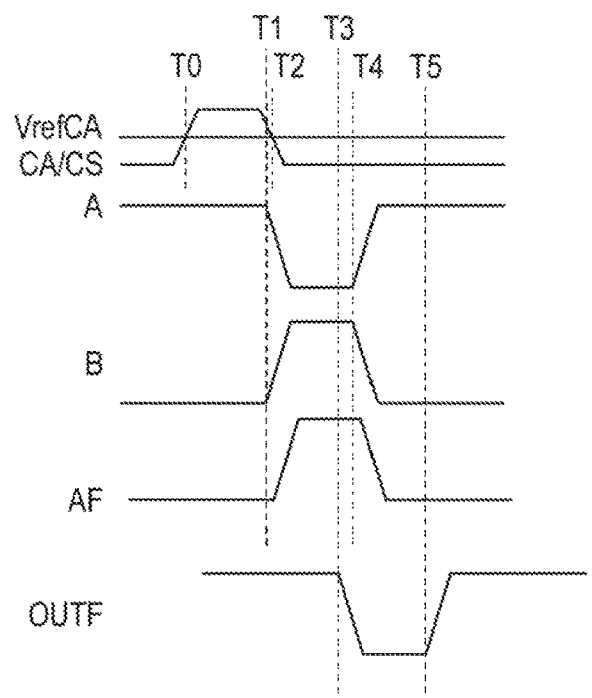
FIG. 3 is a timing diagram of various voltages and signals during operation of a signal receiver circuit.

Operation of the signal receiver circuit 200 will be described with reference to FIG. 3. FIG. 3 is a timing diagram of various voltages and signals during operation of a signal receiver circuit. For example, the signal receiver circuit 200 may be operated as shown in FIG. 3. While not shown in FIG. 3, the EN signal is active.

Prior to time T0, the voltage of the CA/CS signal is less than the VrefCA voltage. As a result, the differential amplifier circuit 210 provides a high logic level voltage to node A and the differential amplifier circuit 215 provides a low logic level voltage to node B. The inverter circuits 220 and 225 latch the high logic level at node A and the low logic level at node B. The high logic level at node A is inverted by the inverter circuit 227 to provide a low logic level at node AF. The low logic level at node AF activates the transistor 230 and the low logic level at node B does not activate the transistor 235, resulting in a high logic level voltage at the common node 237. The inverter circuits 240 and 245 buffer the high logic level voltage and provide a high logic level OUTF.

At time T0, the CA/CS signal changes to a high logic level having a voltage greater than the VrefCA voltage. As a result, the differential amplifier circuit 210 provides a low logic level voltage to node A and the differential amplifier circuit 215 provides a high logic level voltage to node B at time T1. The inverter circuits 220 and 225 latch the low logic level at node A and the high logic level at node B. The low logic level at node A is inverted by the inverter circuit 227 to provide a high logic level at node AF shortly after time T1 to not activate the transistor 230 and the high logic level at node B activates the transistor 235 to provide a low logic level voltage at the common node 237. The inverter circuits 240 and 245 buffer the low logic level voltage and provide a low logic level OUTF output at time T3.

At time T2, the CA/CS signal changes to a low logic level having a voltage less than the VrefCA voltage. As a result, the differential amplifier circuit 210 provides a high logic level voltage to node A and the differential amplifier circuit 215 provides a low logic level voltage to node B at time T4. The inverter circuits 220 and 225 latch the high logic level at node A and the low logic level at node B. The high logic level at node A is inverted by the inverter circuit 227 to provide a low logic level at node AF shortly after time T4 to activate the transistor 230 and the low logic level at node B does not activate the transistor 235, resulting in a high logic level voltage at the common node 237. The inverter circuits 240 and 245 buffer the high logic level voltage and provide a high logic level OUTF output at time T5.

In summary, when the signal receiver circuit 200 is activated by an active EN signal, the signal receiver circuit 200 provides an output OUTF having logic level complementary to the CA/CS signal. For example, when the CA/CS signal is a high logic level (e.g., the voltage of the CA/CS signal is greater than the VrefCA voltage) the signal receiver circuit 200 provides a low logic level OUTF output, and when the CA/CS signal is a low logic level (e.g., the voltage of the CA/CS signal is less than the VrefCA voltage) the signal receiver circuit 200 provides a high logic level OUTF output.

When activated, the differential amplifier circuits 210 and 215 are ready to receive the CA/CS signal and provide logic level voltages to nodes A and B. As a result, the differential amplifier circuits 210 and 215 continuously consume power whenever activated. The continuous power consumption by the differential amplifier circuits 210 and 215 may be undesirable in low-power circuit designs.

Figure 4:
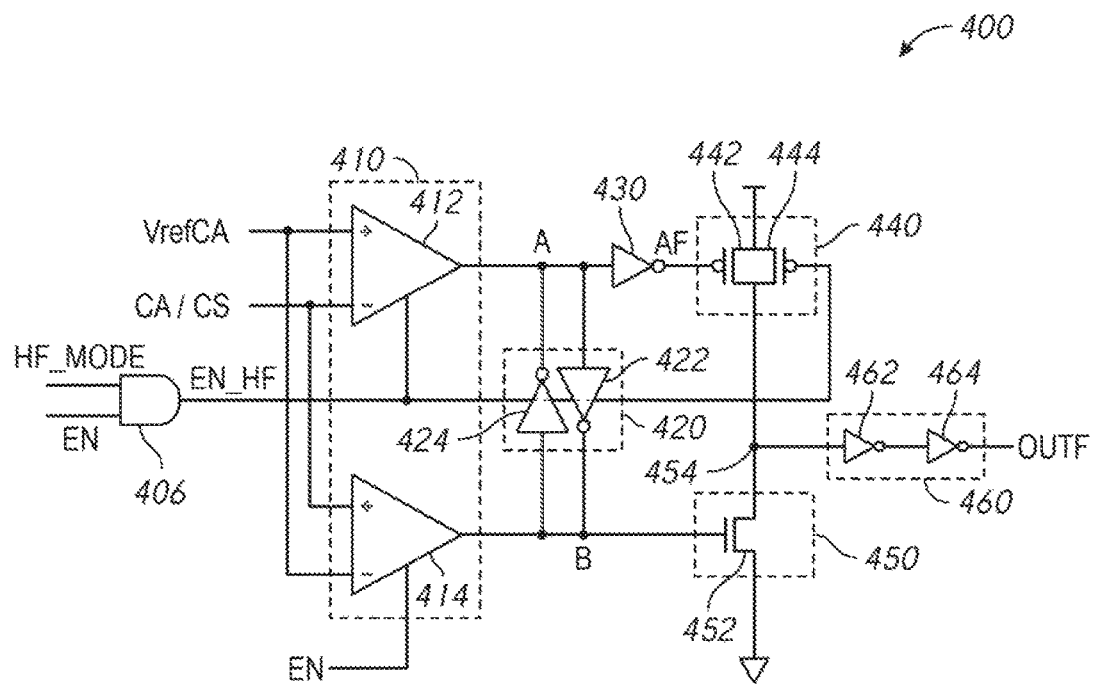
FIG. 4 is a schematic diagram of a signal receiver circuit according to an embodiment of the disclosure.

FIG. 4 is a schematic diagram of a signal receiver circuit 400 according to an embodiment of the disclosure. The signal receiver circuit 400 may be included in the command/address input circuit 105 of FIG. 1 in some embodiments of the disclosure.

The signal receiver circuit 400 includes an amplifier stage 410 that receives a reference voltage VrefCA and an input signal CA/CS. The CA/CS signal may represent command signals, address signals, chip select signals, or the like. The CA/CS signal has a voltage that represents a logic level, for example, a relatively high logic level voltage represents a high logic level (e.g., "1" logic level) and a relatively low logic level voltage represents a low logic level (e.g., "0" logic level). The VrefCA voltage represents a reference voltage against which the voltage of the CA/CS signal is compared.

The amplifier stage 410 further receives an enable signal EN and an enable signal EN_HF. The EN_HF signal is provided by enable circuit 406. The enable circuit 406 provides an active EN_HF signal (e.g., active high logic level) when the EN signal is active (e.g., active high logic level) and a control signal HF_MODE is active (e.g., active high logic level). The HF_MODE signal may indicate when a high-frequency mode is enabled or disabled (e.g., HF_MODE active or inactive, respectively). The high-frequency mode may be enabled when a higher clock frequency is used for operating, for example, the semiconductor device 100. The high-frequency mode may be based on information programmed in a mode register, and a command decoder, for example, command decoder 115, may provide the HF_MODE signal having a logic level based on the information programmed in the mode register. For example, latency information programmed in the mode register may be used to determine whether the HF_MODE provided by the command decoder is active or not active. The EN signal may be provided by the command decoder as well, for example, providing an active EN signal when the semiconductor device is activated. The enable circuit 406 may be an AND logic gate, as shown in FIG. 4. In other embodiments of the disclosure, the enable circuit 406 may include additional or alternative circuits.

The amplifier stage 410 includes an amplifier circuit 412 that receives the VrefCA voltage at a non-inverting input (+) and receives the CA/CS signal at an inverting input (−). The amplifier stage 410 further includes an amplifier circuit 414 that also receives the VrefCA voltage and the CA/CS signal. The amplifier circuits 412 and 414 may be differential amplifier circuits in some embodiments of the disclosure and will be referred to as such herein. However, in other embodiments of the disclosure, other amplifier circuits may be used. Thus, the scope of the disclosure is not limited to an amplifier stage 410 including differential amplifier circuits.

In contrast to the differential amplifier circuit 412, the differential amplifier circuit 414 receives the CA/CS signal at a non-inverting input (+) and receives the VrefCA voltage at an inverting input (−). The differential amplifier circuit 412 further receives the EN_HF signal and the differential amplifier circuit 414 further receives the EN signal. The differential amplifier circuit 412 is activated by an active EN_HF signal and the differential amplifier circuit 414 is activated by an active EN signal.

When activated by an active EN_HF signal (e.g., both EN_MODE and EN signals are active), the differential amplifier circuit 412 provides an output to node A having a voltage that represents a high logic level, for example, a high logic level voltage, when the voltage of the CA/CS signal is less than the VrefCA voltage. Conversely, when the voltage of the CA/CS signal is greater than the VrefCA voltage, the differential amplifier circuit 412 provides an output to node A having a voltage that represents a low logic level, for example, a low logic level voltage. When not activated by the EN_HF signal, the differential amplifier circuit 412 provides a logic level voltage to the node A (e.g., the low logic level voltage). When activated by an active EN signal, the differential amplifier circuit 414 provides an output to node B having a voltage that represents a low logic level, for example, the low logic level voltage, when the voltage of the CA/CS signal is less than the VrefCA voltage. Conversely, when the voltage of the CA/CS signal is greater than the VrefCA voltage, the differential amplifier circuit 414 provides an output to node B having a voltage that represents a high logic level, for example, the high logic level voltage. In some embodiments of the disclosure, the differential amplifier circuit 414 provides a high impedance to node B when not activated by the EN signal. In some embodiments of the disclosure, the differential amplifier circuit 414 provides a logic level voltage to node B when not activated by the EN signal (e.g., a high logic level voltage).

Thus, when the EN signal is active and HF_MODE signals is active (high-frequency operation enabled), the amplifier stage 410 provides a first output to node A having a complementary logic level to the CA/CS signal and provides a second output to node B having a same logic level as the CA/CS signal, and when the EN signal is active but the HF_MODE signal is not active (high-frequency operation not enabled), the amplifier stage 410 provides the first output to node A unrelated to the CA/CS signal and provides the second output to node B having the same logic level as the CA/CS signal.

Receipt of the CA/CS signal and the VrefCA voltage at opposite inputs for the differential amplifier circuits 412 and 414 cause the differential amplifier circuits to provide respective outputs that are complementary. For example, when the voltage of the CA/CS signal is greater than the VrefCA voltage, the differential amplifier circuit 412 provides a low logic level output to node A and the differential amplifier circuit 414 provides a high logic level output to node B. Conversely, when the voltage of the CA/CS signal is less than the VrefCA voltage, the differential amplifier circuit 412 provides a high logic level output to node A and the differential amplifier circuit 414 provides a low logic level output to node B. As illustrated, the differential amplifier circuits 412 and 414 are used to provide differential signals from the single ended CA/CS signal.

The signal receiver circuit 400 further includes a latch circuit 420 coupled to nodes A and B. The latch circuit 420 is provided the EN_HF signal. The latch circuit 420 latches the logic levels at nodes A and B provided by the differential amplifier circuits 412 and 414, respectively, when activated by an active EN_HF signal. The latch circuit 420 is optional, however, and in some embodiments of the disclosure, the latch circuit 420 is omitted from the signal receiver circuit. The latch circuit includes inverter circuits 422 and 424 coupled to nodes A and B. When activated by an active EN_HF signal, each of the inverter circuits 422 and 424 provide a respective output that having a logic level complementary to the logic level of a respective input signal.

The output of the differential amplifier circuit 412 is inverted by an inverter circuit 430 to provide an output at node AF that is the complement of the logic level at node A. The complement of the output of the differential amplifier circuit 412 is provided to pull-up circuit 440. The voltage at node B is provided to a pull-down circuit 450. The pull-up circuit 440 and pull-down circuit 450 are coupled at a common node 454. The pull-up circuit 440 is further coupled to a power supply that provides a high logic level voltage and pull-down circuit 450 is further coupled to a voltage reference, such as ground, that may represent a low logic level voltage.

The pull-up circuit 440 provides the high logic level voltage to the common node 454 when activated and the pull-down circuit 450 provides the low logic level voltage to the common node 454 when activated. Activation of the pull-up circuit 440 is controlled by the output of the inverter circuit 430 and activation of the pull-down circuit 450 is controlled by the voltage at node B. In some embodiments of the disclosure, the pull-up circuit 440 is activated when a high logic level voltage is provided at the node A (and a low logic level voltage is provided by the inverter circuit 430), and the pull-down circuit 450 is activated when a high logic level voltage is provided at node B. In some embodiments of the disclosure, the pull-up circuit 440 is also activated when the EN_HF signal is not active.

When the EN_HF signal is active and when a high logic level output is provided to node A and a low logic level output is provided to node B, the pull-up circuit 440 is activated and the pull-down circuit 450 is not activated. As a result, a high logic level is provided at the common node 454. When the EN_HF signal is active and when a low logic level output is provided to node A and a high logic level output is provided to node B, the pull-up circuit 440 is not activated and the pull-down circuit 450 is activated. As a result, a low logic level is provided at the common node 454.

The pull-up circuit 440 is shown in FIG. 4 as including a p-channel transistor 442 and a p-channel transistor 444 coupled in parallel to the power supply and the common node 454. The transistor 444 is controlled by the EN_HF signal. The transistor 444 may be activated when the EN_HF signal is not active. When activated, the transistor 444 provides a resistive load between the power supply and the common node 454. The p-channel transistor 444 is optional and may be omitted from the pull-up circuit 440 in some embodiments of the disclosure. In some embodiments of the disclosure, the pull-up circuit 440 may represent a resistive coupling between the power supply and the common node 454 when the EN_HF signal is not active. The pull-down circuit 450 is shown in FIG. 4 as including a n-channel transistor 452. Additional or alternative circuits may be included in the pull-up circuit 440 and/or the pull-down circuit 450 in some embodiments of the disclosure.

A buffer circuit 460 buffers the voltage at the common node 454 to provide an output OUTF. The buffer circuit 460 is shown in FIG. 4 as including series coupled inverter circuits 462 and 464. Additional or alternative circuits may be included in the buffer circuit 460 in some embodiments of the disclosure. The buffer circuit 460 is optional, and may be omitted in some embodiments of the disclosure.

In summary, when the signal receiver circuit 400 is activated by an active EN signal, but the HF_MODE signal is not active (e.g., the high-frequency mode is not enabled), the signal receiver circuit 400 provides an output OUTF having a logic level complementary to the CA/CS signal. For example, when the CA/CS signal is a high logic level (e.g., the voltage of the CA/CS signal is greater than the VrefCA voltage) the signal receiver circuit 400 provides a low logic level OUTF output, and when the CA/CS signal is a low logic level (e.g., the voltage of the CA/CS signal is less than the VrefCA voltage) the signal receiver circuit 400 provides a high logic level OUTF output.

When the signal receiver circuit 400 is activated by an active EN signal and the HF_MODE signal is active (e.g., the high-frequency mode is enabled), the signal receiver circuit 400 provides an output OUTF having a logic level complementary to the CA/CS signal. For example, when the CA/CS signal is a high logic level the signal receiver circuit 400 provides a low logic level OUTF output, and when the CA/CS signal is a low logic level the signal receiver circuit 400 provides a high logic level OUTF output.

The signal receiver circuit 400 may be operated in different modes as controlled by the EN and HF_MODE signals. In particular, the signal receiver circuit 400 may be operated with both differential amplifier circuits 412 and 414 of the amplifier stage activated, such as when a high-frequency mode is enabled by an active HF_MODE signal.

The signal receiver circuit 400 may also be operated with the differential amplifier circuit 412 not activated and the differential amplifier circuit 414 activated, such as when the high-frequency mode is not enabled by an inactive HF_MODE signal. While the differential amplifier circuit 414 is activated when the EN signal is active, the differential amplifier circuit 412 is not activated unless the HF_MODE is also active. The signal receiver circuit 400 may consume less power when the differential amplifier circuit 414 is activated and the differential amplifier circuit 412 is not activated compared to when both the differential amplifier circuits 412 and 414 are activated. As a result, the differential amplifier circuit 412 is not used unless a high-frequency mode is enabled, thereby reducing power consumption by the signal receiver circuit 400 when a high-frequency mode is not enabled.

Figure 5:
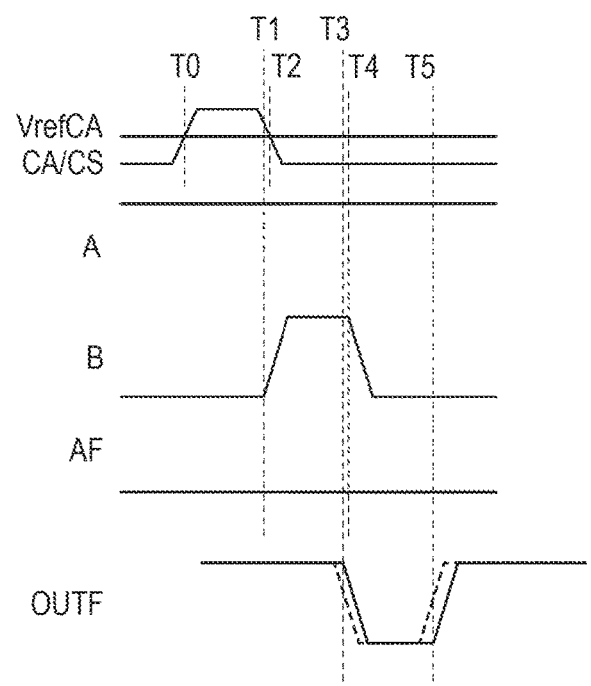
FIG. 5 is a timing diagram of various voltages and signals during operation of the signal receiver circuit of FIG. 4.

Operation of the signal receiver circuit 400 will be described with reference to FIG. 5. FIG. 5 is a timing diagram of various voltages and signals during operation of the signal receiver circuit 400.

While not shown in FIG. 5, the EN signal is active, but the HF_MODE signal is inactive. The inactive HF_MODE signal indicates that a high-frequency mode of operation is not enabled. The active EN signal activates the differential amplifier circuit 414 of the amplifier stage. The inactive HF_MODE signal causes the enable circuit 406 to provide a low logic level EN_HF signal. The low logic level EN_HF signal causes the differential amplifier circuit 412 and the latch circuit 420 to be not activated. The low logic level EN_HF signal may further activate the p-channel transistor 444 of the pull-up circuit 440, if included. With the differential amplifier circuit 412 not activated, the output to node A is a high logic level and the output at node AF is a low logic level, thereby activating the p-channel transistor 442. As a result, the activated p-channel transistor 442 provides a resistive load between the power supply and the common node 454. The not activated differential amplifier circuit 412 consumes less power than when activated (e.g., when the HF_MODE signal is active). Thus, compared to operating with both the differential amplifier circuits 412 and 414 both activated, the signal receiver circuit 400 consumes less power when the HF_MODE signal is not active (e.g., the high-frequency mode not enabled).

Prior to time T0, the voltage of the CA/CS signal is less than the VrefCA voltage. As a result, the differential amplifier circuit 414 provides a low logic level voltage to node B, which does not activate the pull-down circuit 450. As previously described, the pull-up circuit 440 is activated by the low logic level at node AF, which results from the default high logic level at node A provided by the not activated differential amplifier circuit 412. Additionally, if included, the p-channel transistor 444 of the pull-up circuit 440 is activated by the low logic level EN_HF signal. As a result, a high logic level voltage is provided at the common node 454. The buffer circuit 460 buffers the high logic level voltage at the common node 454 to provide a high logic level OUTF output prior to time T0.

At time T0, the CA/CS signal changes to a high logic level having a voltage greater than the VrefCA voltage. As a result, the differential amplifier circuit 414 provides a high logic level voltage to node B at time T1 to activate the pull-down circuit 450. The transistor 452 of the pull-down circuit 450 has greater drive strength than the activated pull-up circuit 440, and consequently, the activated pull-down circuit 450 provides a low logic level voltage at the common node 454. The buffer circuit 460 buffers the low logic level voltage at the common node 454 to provide a low logic level OUTF output at time T3. The timing of when the OUTF output changes from a high logic level to a low logic level at time T3 relative to when node B changes from a low logic level to a high logic level at time T1 may be different compared to changes at node B and the OUTF output of FIG. 3. With reference to FIG. 5, due to the activated p-channel transistor 444 (activated by the low logic level EN_HF signal), which has a relatively weak drive strength, the transition time of the common node 454 to a low logic level may be slower than a transition of the common node 237 for FIG. 3. The slower transition of the common node 454 to a low logic level may result in a delay to when the buffer circuit 460 is triggered to provide a low logic level OUTF output compared to FIG. 3 (timing of the OUTF output of FIG. 3 is shown in FIG. 5 in dashed line for comparison).

At time T2, the CA/CS signal changes to a low logic level having a voltage less than the VrefCA voltage. As a result, the differential amplifier circuit 414 provides a low logic level voltage to node B at time T4 to not activate the pull-down circuit 450. With the pull-down circuit 450 not activated, the activated pull-up circuit 440 provides a high logic level voltage to the common node 454. The buffer circuit 460 buffers the high logic level voltage at the common node 454 to provide a high logic level OUTF output at time T5. The timing of when the OUTF output changes from a low logic level to a high logic level at time T5 relative to when node B changes from a high logic level to a low logic level at time T4 may be different compared to changes at node B and the OUTF output of FIG. 3. With reference to FIG. 5, due to the activated p-channel transistor 444 (activated by the low logic level EN_HF signal), which has a relatively weak drive strength, the transition time of the common node 454 to a high logic level may be slower than a transition of the common node 237 for FIG. 3. The slower transition of the common node 454 to a high logic level may result in a delay to when the buffer circuit 460 is triggered to provide a high logic level OUTF output compared to FIG. 3 (timing of the OUTF output of FIG. 3 is shown in FIG. 5 in dashed line for comparison). Additionally, the delay for the OUTF output changing to a high logic level at time T5 in FIG. 5 may be greater than the delay for the OUTF output changing to a low logic level at time T3 in FIG. 5 due to the activated n-channel transistor 452 working against the activated p-channel transistor 444 for pull down compared to having only the activated (relatively weak) p-channel transistor 444 for pull up (as indicated in FIG. 5 by the greater delay of the rising edge OUTF output relative to the dashed line compared to the delay of the falling edge OUTF output).

When both the EN signal and the HF_MODE signal are active, the enable circuit 406 provides a high logic level EN_HF signal (not shown in FIG. 5). The high logic level EN_HF signal activates the differential amplifier circuit 412 and the latch circuit 420. If included, the high logic level EN_HF signal does not activate the p-channel transistor 444 of the pull-up circuit 440. As a result, the differential amplifier circuits 412 and 414, and the latch circuit 420 are activated. Operation of the signal receiver circuit 400 when the EN and HF_MODE signals are active is similar to that previously described with reference to FIG. 3. The operation of the signal receiver circuit 400 when the EN and HF_MODE signals are active will not be described with reference to FIG. 3 in the interest of brevity. Operation of the signal receiver circuit 400 with both the differential amplifier circuits 412 and 414 activated may be desirable when higher frequency signaling is used for the CA/CS signal.

In summary, when the signal receiver circuit 400 is activated by active EN and HF_MODE signals, the signal receiver circuit 400 operates with both differential amplifier circuits 412 and 414 activated to provide an output OUTF having a logic level complementary to the CA/CS signal. In contrast, when the signal receiver 400 is activated by an active EN signal, but the HF_MODE signal is not active, the signal receiver circuit 400 operates with differential amplifier circuit 414 activated, but the differential amplifier circuit 412 is not activated to provide an output OUTF having a logic level complementary to the CA/CS signal. With the differential amplifier circuit 412 not activated, power consumption by the signal receiver circuit 400 is less than when both differential amplifier circuits 412 and 414 are activated together. Operation of the signal receiver circuit 400 with a differential amplifier circuit not activated may be desirable when lower frequency signaling is used for the CA/CS signal.

Figure 6:
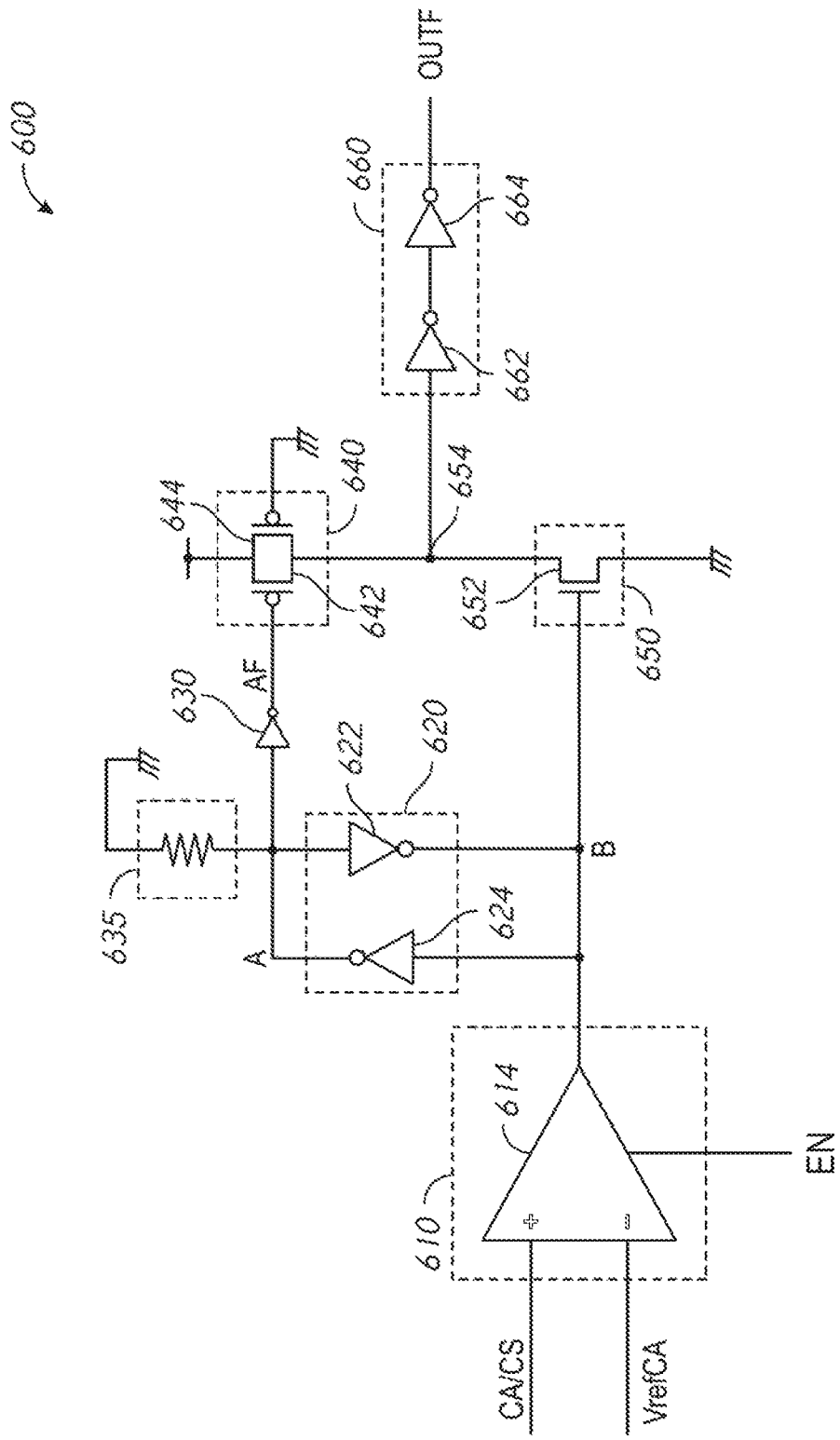
FIG. 6 is a schematic diagram of a signal receiver circuit according to an embodiment of the disclosure.

FIG. 6 is a schematic diagram of a signal receiver circuit 600 according to an embodiment of the disclosure. The signal receiver circuit 600 may be included in the command/address input circuit 105 of FIG. 1 in some embodiments of the disclosure.

The signal receiver circuit 600 includes an amplifier stage 610 that receives a reference voltage VrefCA and an input signal CA/CS. The amplifier stage 610 further receives an enable signal EN. The amplifier stage 610 includes an amplifier circuit 614 that receives the CA/CS signal at a non-inverting input (+) and receives the VrefCA voltage at an inverting input (−). The amplifier circuits 614 may be a differential amplifier circuit in some embodiments of the disclosure and will be referred to as such herein. However, in other embodiments of the disclosure, other amplifier circuits may be used. Thus, the scope of the disclosure is not limited to an amplifier stage 610 including a differential amplifier circuit.

The CA/CS signal may represent command signals, address signals, chip select signals, or the like. The CA/CS signal has a voltage that represents a logic level, for example, a relatively high logic level voltage represents a high logic level (e.g., "1" logic level) and a relatively low logic level voltage represents a low logic level (e.g., "0" logic level). The VrefCA voltage represents a reference voltage against which the voltage of the CA/CS signal is compared by the differential amplifier circuit 614 when activated. The differential amplifier circuit 614 is activated by an active EN signal (e.g., active high logic level).

When activated by an active EN signal, the differential amplifier circuit 614 provides an output to node B having a voltage that represents a low logic level, for example, the low logic level voltage, when the voltage of the CA/CS signal is less than the VrefCA voltage. Conversely, when the voltage of the CA/CS signal is greater than the VrefCA voltage, the differential amplifier circuit 614 provides an output to node B having a voltage that represents a high logic level, for example, the high logic level voltage. In some embodiments of the disclosure, the differential amplifier circuit 614 provides a high impedance to node B when not activated by the EN signal. In some embodiments of the disclosure, the differential amplifier circuit 614 provides a logic level voltage to node B when not activated by the EN signal (e.g., a high logic level voltage).

The signal receiver circuit 600 further includes a latch circuit 620 coupled to nodes A and B. The latch circuit 620 latches the logic level at node B provided by the differential amplifier circuit 614. The latch circuit 620 is optional, however, and in some embodiments of the disclosure, the latch circuit 620 is omitted from the signal receiver circuit. The latch circuit 620 includes inverter circuits 622 and 624 coupled to nodes A and B. Each of the inverter circuits 622 and 624 provide a respective output having a logic level complementary to the logic level of a respective input signal.

A load circuit 635 is also coupled to node A and to a voltage reference, such as ground. The load circuit 635 provides a resistive coupling to ground. The load circuit 635 is shown in FIG. 6 as a resistor, but additional or alternative circuits may be included in the load circuit 635 in other embodiments of the disclosure. The load circuit 635 is optional, and may be omitted in some embodiments of the disclosure. When included, the load circuit 635 pulls the node A to a low logic level voltage when not driven by the inverter circuit 624, for example, the differential amplifier circuit 614 is not enabled (e.g., the EN signal is not active) and the differential amplifier circuit 614 does not provide a default logic level voltage.

A logic level voltage at node A is inverted by an inverter circuit 630 to provide an output at node AF that is the complement of the logic level at node A. The output at node AF is provided to pull-up circuit 640. The voltage at node B is provided to a pull-down circuit 650. The pull-up circuit 640 and pull-down circuit 650 are coupled at a common node 654. The pull-up circuit 640 is further coupled to a power supply that provides a high logic level voltage and pull-down circuit 650 is further coupled to a voltage reference, such as ground, that may represent a low logic level voltage.

The pull-up circuit 640 provides the high logic level voltage to the common node 654 when activated and the pull-down circuit 650 provides a low logic level voltage to the common node 654 when activated. Activation of the pull-up circuit 640 is controlled by the output of the inverter circuit 630 and activation of the pull-down circuit 650 is controlled by the voltage at node B. In some embodiments of the disclosure, the pull-up circuit 640 is activated when a high logic level voltage is provided at the node A (and a low logic level voltage is provided by the inverter circuit 630 to node AF), and the pull-down circuit 650 is activated when a high logic level voltage is provided at node B.

When a low logic level output is provided to node B and a high logic level output is provided to node A, the pull-up circuit 640 is activated and the pull-down circuit 650 is not activated. As a result, a high logic level is provided at the common node 654. When a high logic level output is provided to node B and a low logic level output is provided to node A, the pull-up circuit 640 is not activated and the pull-down circuit 650 is activated. As a result, a low logic level is provided at the common node 654.

The pull-up circuit 640 is shown in FIG. 6 as including a p-channel transistor 642 and a p-channel transistor 644 coupled in parallel to the power supply and the common node 654. The transistor 644 is activated by having a gate coupled to the voltage reference. As a result, the transistor 644 is continually activated to provide a resistive load between the power supply and the common node 654. The p-channel transistor 644 is optional and may be omitted from the pull-up circuit 640 in some embodiments of the disclosure. In some embodiments of the disclosure, the pull-up circuit 640 may provide a resistive coupling between the power supply and the common node 654. The pull-down circuit 650 is shown in FIG. 6 as including a n-channel transistor 652. Additional or alternative circuits may be included in the pull-up circuit 640 and/or the pull-down circuit 650 in some embodiments of the disclosure.

A buffer circuit 660 buffers the voltage at the common node 654 to provide an output OUTF. The buffer circuit 660 is shown in FIG. 6 as including series coupled inverter circuits 662 and 664. Additional or alternative circuits may be included in the buffer circuit 660 in some embodiments of the disclosure. The buffer circuit 660 is optional, and may be omitted in some embodiments of the disclosure.

Operation of the signal receiver circuit 600 when the EN signal is active is similar to that previously described with reference to FIG. 3. The operation of the signal receiver circuit 600 when the EN signal is active will not be described with reference to FIG. 3 in the interest of brevity. In some embodiments of the disclosure, when the EN signal is not active the signal receiver circuit 600 provides a low logic level OUTF output. When the EN signal is not active, the differential amplifier circuit 614 is not activated. The differential amplifier circuit 614 may provide a high impedance to node B when not activated by the EN signal in some embodiments of the disclosure. The load circuit 635 pulls the node A to a low logic level, if included. The low logic level at node A causes a high logic level at node B, which activates the pull-down circuit 650 to provide a low logic level voltage at the common node 654. In some embodiments of the disclosure, the differential amplifier circuit 614 provides a logic level voltage to node B when not activated by the EN signal (e.g., a high logic level voltage). In such embodiments of the disclosure where a high logic level voltage is provided by the differential amplifier circuit 614 when not activated by the EN signal, the pull-down circuit 650 is activated to provide a low logic level voltage at the common node 654.

In summary, when the signal receiver circuit 600 is activated by an active EN signal, the signal receiver circuit 600 provides an output OUTF having logic level complementary to the CA/CS signal. For example, when the CA/CS signal is a high logic level (e.g., the voltage of the CA/CS signal is greater than the VrefCA voltage) the signal receiver circuit 600 provides a low logic level OUTF output, and when the CA/CS signal is a low logic level (e.g., the voltage of the CA/CS signal is less than the VrefCA voltage) the signal receiver circuit 600 provides a high logic level OUTF output. In some embodiments of the disclosure, when the signal receiver circuit 600 is not activated by the EN signal, the signal receiver signal provides a low logic level OUTF output.

In contrast to the signal receiver circuit 400, the signal receiver circuit 600 includes one differential amplifier circuit 614 instead of multiple differential amplifier circuits (e.g., differential amplifier circuits 412 and 414, with reference to the signal receiver circuit 400). By using one differential amplifier circuit to provide the OUTF output, the signal receiver circuit 600 will generally consume less power than the signal receiver circuit 400 when operated with both differential amplifier circuits 412 and 414 activated (e.g., HF_MODE active for high-frequency operation). Additionally, the signal receiver circuit 600 will generally have similar power consumption to the signal receiver circuit 400 when operated with one differential amplifier circuit 414 activated (e.g., HF_MODE not active to disable the differential amplifier circuit 412), but the signal receiver circuit 600 does not have the added circuit complexity of the differential amplifier circuit 412 and enable circuit 406. Thus, the signal receiver circuit 600 may have a smaller circuit size than the signal receiver circuit 400.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
  an amplifier stage configured to receive a reference voltage and an input signal, the amplifier stage configured to provide in a first mode a first output having a complementary logic level to the input signal and a second output having a same logic level to the input signal and further configured to provide in a second mode the first output unrelated to the input signal and the second output having a same logic level to the input signal;
  a pull-up circuit configured to provide a high logic level voltage to a common node when activated by the first output; and
  a pull-down circuit configured to provide a low logic level voltage to the common node when activated by the second output.

2. The apparatus of claim 1, wherein the amplifier stage comprises:
  a first differential amplifier circuit configured to provide in the first mode the first output based on a voltage of the input signal relative to the reference voltage and further configured to provide in the second mode the first output having a default logic level voltage; and
  a second differential amplifier circuit configured to provide in the first and second modes the second output based on the voltage of the input signal relative to the reference voltage.

3. The apparatus of claim 2, wherein the first differential amplifier circuit and the second differential amplifier circuit are activated in the first mode, and in the second mode, the first differential amplifier circuit is not activated and the second differential amplifier circuit is activated.

4. The apparatus of claim 3, further comprising an enable circuit configured to receive a first enable signal also provided to the second differential amplifier and to further receive a second enable signal having a logic level indicative of the first or second mode, the enable circuit configured to provide a third enable signal to control activation of the first differential amplifier.

5. The apparatus of claim 1, wherein the pull-up circuit comprises a p-channel transistor configured to provide the high logic level voltage to the common node when activated by the first output and wherein the pull-down circuit comprises an n-channel transistor configured to provide the low logic level voltage to the common node when activated by the second output.

6. The apparatus of claim 5 wherein the pull-up circuit further comprises a second p-channel transistor configured provide the high logic level voltage to the common node in the first mode.

7. The apparatus of claim 1, further comprising a latch circuit configured to latch the first and second outputs in the first mode.

8. An apparatus, comprising:
  an amplifier circuit configured to receive a reference voltage and an input signal, the amplifier circuit configured to provide an output having a same logic level to the input signal;
  a latch circuit configured to latch the output of the amplifier circuit and provide a first latched logic level and a second latched logic level complementary to the first latched logic level;

a pull-up circuit configured to provide a resistive coupling between a power supply providing a high logic level voltage and a common node; and a pull-down circuit configured to provide a low logic level voltage to the common node when activated by the second latched logic level.

9. The apparatus of claim 8 wherein the amplifier circuit comprises a differential amplifier circuit.

10. The apparatus of claim 8 wherein the pull-up circuit comprises a p-channel transistor configured to be activated by a complement of the first latched logic level.

11. The apparatus of claim 10 wherein the pull-up circuit further comprises a second p-channel transistor configured to be continually activated.

12. The apparatus of claim 8 wherein the pull-down circuit comprises an n-channel transistor configured to be activated by the second latched logic level.

13. The apparatus of claim 8, further comprising a load circuit configured to resistively couple the first latched logic level to a voltage reference.

14. The apparatus of claim 8, further comprising first and second series coupled inverter circuits coupled to the common node and configured to provide an output having a logic level that is complementary to the logic level of the input signal.

15. An apparatus, comprising:
a first amplifier circuit configured to receive a reference voltage and an input signal and configured to receive a first enable signal, the first amplifier circuit further configured to provide a first output having a logic level based on a voltage of the input signal relative to the reference voltage when activated by the first enable signal and to provide a logic level voltage when not activated by the first enable signal;

a second amplifier circuit configured to receive the reference voltage and the input signal and configured to receive a second enable signal, the second amplifier circuit further configured to provide a second output having a logic level based on a voltage of the input signal relative to the reference voltage when activated by the second enable signal, wherein the second output is complementary to the first output when both the first and second amplifier circuits are activated;

an inverter circuit configured to provide an output that is complementary to the logic level of the first output;

a first transistor configured to provide a high logic level voltage to a common node when activated by the output from the inverter circuit, wherein the first transistor is activated by the complement of the logic level voltage when the first amplifier circuit is not activated; and a second transistor configured to provide a low logic level voltage to the common node when activated by the second output.

16. The apparatus of claim 15, further comprising:
a first inverter circuit coupled to outputs of the first and second amplifier circuits and configured to invert the first output; and a second inverter circuit coupled to the outputs of the first and second amplifier circuits and configured to invert the second output.

17. The apparatus of claim 15, further comprising a third transistor coupled in parallel to the first transistor and configured to provide the high logic level voltage to the common node when the first amplifier circuit is not activated.

18. The apparatus of claim 17 wherein the second transistor has greater drive strength than the third transistor.

19. The apparatus of claim 15 wherein the first amplifier circuit is activated by the first enable signal responsive to high-frequency operation.

20. The apparatus of claim 15, further comprising a buffer circuit configured to buffer a voltage at the common node and provide an output, wherein the output is complementary to the logic level of the input signal.

* * * * *